| [19] | United States Patent | [11] | Patent Number: | 4,658,298 |
|---|---|---|---|---|
| | Takeda et al. | [45] | Date of Patent: | Apr. 14, 1987 |

[54] PORTABLE TYPE AUDIO-VISUAL SENSORY APPARATUS

[75] Inventors: Mituo Takeda; Katunobu Odamoto; Keiji Uraki, all of Osaka, Japan

[73] Assignee: El Planning System Ltd., Osaka, Japan

[21] Appl. No.: 739,017

[22] Filed: May 29, 1985

[30] Foreign Application Priority Data

| May 30, 1984 | [JP] | Japan | 59-80060 |
|---|---|---|---|
| Dec. 29, 1984 | [JP] | Japan | 59-200425 |
| Dec. 29, 1984 | [JP] | Japan | 59-200426 |
| Dec. 29, 1984 | [JP] | Japan | 59-200427 |
| Dec. 29, 1984 | [JP] | Japan | 59-200428 |
| Dec. 29, 1984 | [JP] | Japan | 59-200429 |
| May 1, 1985 | [JP] | Japan | 60-95146 |

[51] Int. Cl.$^4$ .......................................... H04N 5/64
[52] U.S. Cl. ...................... 358/254; 312/7.2; 312/20; 206/320; D3/33; 224/908
[58] Field of Search ............... 206/320, 315, 305, 813, 206/387; 312/7.1

[56] References Cited

U.S. PATENT DOCUMENTS

| D. 281,200 | 11/1982 | Thrush | D3/33 |
|---|---|---|---|
| 2,087,863 | 7/1937 | Sharp | 312/20 |
| 2,335,015 | 11/1943 | Lantheaume | 206/813 |
| 2,517,387 | 8/1950 | Cunningham et al. | 312/20 |
| 2,902,688 | 9/1959 | Foster | 312/7.2 |
| 3,019,300 | 1/1962 | Gormel | 369/76 |
| 3,023,885 | 3/1962 | Kindseth | 206/305 |
| 3,450,454 | 6/1969 | Anders . | |
| 3,471,947 | 10/1969 | Genser | 358/254 |
| 3,515,046 | 6/1970 | Ippolito et al. | 312/20 |
| 3,541,452 | 11/1970 | Disesa et al. | 455/351 |
| 3,572,873 | 3/1971 | Harting, Jr. | 312/7.1 |
| 3,761,643 | 9/1973 | Keeler, II | 360/74.6 |
| 4,131,805 | 12/1978 | Austin et al. | 339/154 R |
| 4,132,295 | 1/1979 | Hochfelsen | 455/344 |
| 4,154,339 | 5/1979 | Dutra | 206/315 |
| 4,173,024 | 10/1979 | Miller | 312/7.2 |
| 4,245,872 | 1/1981 | Kakigi | 312/242 |
| 4,258,387 | 3/1981 | Lemelson et al. | 358/254 |
| 4,398,212 | 8/1983 | Serry et al. | 358/93 |
| 4,400,743 | 8/1983 | Takimoto et al. | 358/335 |
| 4,440,457 | 4/1984 | Fogelman et al. | 312/72 |
| 4,458,813 | 7/1984 | Tushinsky et al. | 206/320 |
| 4,462,525 | 7/1984 | Pingleton et al. | 224/908 |
| 4,491,979 | 1/1985 | Ogasawara et al. | 312/7.2 |

FOREIGN PATENT DOCUMENTS

| 1145678 | 3/1963 | Fed. Rep. of Germany | 358/254 |
|---|---|---|---|
| 2263915 | 7/1974 | Fed. Rep. of Germany | 206/305 |
| 2071043 | 9/1981 | United Kingdom | 150/52 R |
| 2092804 | 8/1982 | United Kingdom | 206/387 |

*Primary Examiner*—Edward L. Coles, Sr.
*Attorney, Agent, or Firm*—Birch, Stewart, Kolasch & Birch

[57] ABSTRACT

A portable case for audio-visual apparatus includes a first case portion having a bottom portion and three side walls connected thereto forming a substantial portion of a generally rectangular box. A second case portion has a front and top cover and is connected to the first portion to complete a generally rectangular box. A partition piece divides the interior of the case into a first and second section. A TV monitor is removably mounted in the first section and a device for developing the signal displayed on the TV monitor is removably mounted in the second section. A switching power source in the case receives power from an external source and supplies it to the TV monitor and developing means. A shielding component is provided to prevent any noises from the switching power sources from interfering with operation of the TV monitor and developing device.

17 Claims, 30 Drawing Figures

F I G. 18
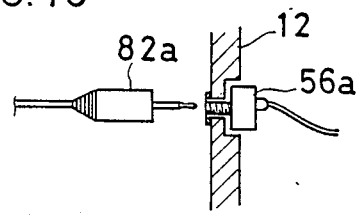
F I G. 19
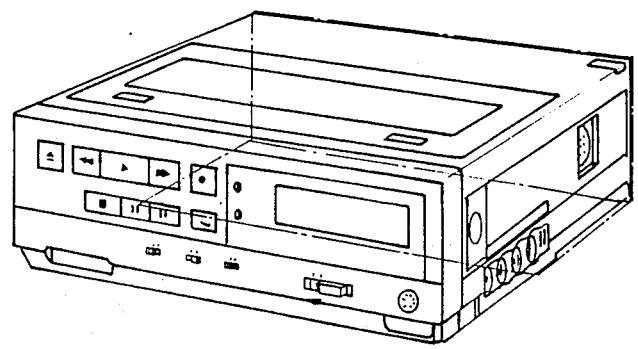
F I G. 20
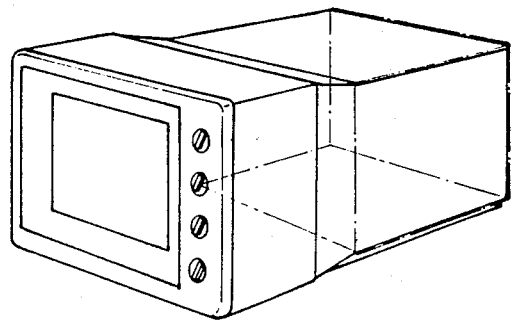

321

325

PORTABLE TYPE AUDIO-VISUAL SENSORY APPARATUS

BACKGROUND OF THE INVENTION

1. Field of the Invention

The present invention relates to a case for a portable type audio-visual apparatus. More specifically, the present invention relates to a case for a portable type audio-visual apparatus, wherein a monitor unit and a video deck, for example, are contained in the case.

2. Description of the Prior Art

Conventionally, a portable type audio-visual sensory apparatus is contained in one case, with a video deck and a TV monitor system being stored in proximity together with their individual power source unit.

SUMMARY OF THE INVENTION

With this conventional portable type audio-visual apparatus, a switching power source unit is usually used as the power source unit. This is because the use of a switching power source unit can make the portable type audio-visual apparatus compact and efficient. However use of a switching power source will cause it to generate noises which enter into the preamplifier circuit or are picked up by the choke coil of the TV monitor system. Moreover, noises originating from the deflecting coil of the high voltage transformer of the TV monitor system may enter into the preamplifier circuit of the video deck, and can be further forwarded to the TV monitor system via its image and audio line in amplified form, so as to adversely influence the image of the TV monitor system.

It is, therefore, a main objective of the present invention to provide a portable type audio-visual apparatus so that any adverse effects against the picture image from the noises originating from the power source unit and the monitor system is precluded.

This invention relates to a case for a portable type audio-visual apparatus comprising a shielding unit made of conductive material which shields the areas between the case and the video apparatus it contains, and the area between the monitor unit connected to the output of the video apparatus contained in the case and switching power source supplying power to the video apparatus contained in the case and the monitor system also contained in the case, respectively.

Consequently, the shielding unit shields the noises originating from the switching power source unit and the TV monitor system.

With the present invention, it is possible to obtain a portable type audio-visual apparatus, wherein noises originating from the switching power source and the TV monitor are not adversely influencing other component units. As a result, the voices and images of the portable type audio-visual apparatus do not contain noise.

BRIEF DESCRIPTION OF THE DRAWINGS

The present invention will become more fully understood form the detailed description given hereinbelow and the accompanying drawings which are given by way of illustration only, and thus are not limitative of the present invention, and wherein:

FIGS. 2 through 7 show an embodiment of the present invention, in which FIG. 2 is a perspective view, FIG. 3 is a front view, FIG,. 4 is an internal plan view, FIG. 5 is a right side view, FIG. 6 is a left side view and FIG. 7 is a rear view thereof.

FIGS. 9 and 10 show an example of an RF drawer cord, in which FIG. 9 is a perspective view showing the insertion state of a female coaxial connector onto a male coaxial connector and FIG. 10 is a perspective view showing the disengaged state of the female coaxial connector from the male coaxial connector.

FIGS. 14 and 15 show an example of a shield box constituting a part of a shield member, in which FIG. 14 is a perspective view of the shield box for a video deck and FIG. 15 is a perspective view of the shield box for a TV monitor.

FIGS. 16 through 17 show an example of the present invention, in which FIG. 16 is a front view, and FIG. 17 is a right side view thereof.

FIG. 18 is a view showing a pin jack and a pin plug as an example of a jack and a plug.

FIG. 19 is a perspective view showing a preferred example of the portions of a video-deck to be shielded in single broken lines.

FIG. 20 is a perspective view showing a preferred example of the portions of a TV monitor to be shielded in single broken lines.

FIGS. 28 through 30 are drawings showing reproduced pictures, in which FIG. 28 shows a reproduced picture of a Sample I (a prior art example), FIG. 29 shows a reproduced picture of a Sample II and FIG. 30 shows a reproduced picture of a Sample III (the embodiment).

DESCRIPTION OF THE PREFERRED EMBODIMENTS

Figure 1:
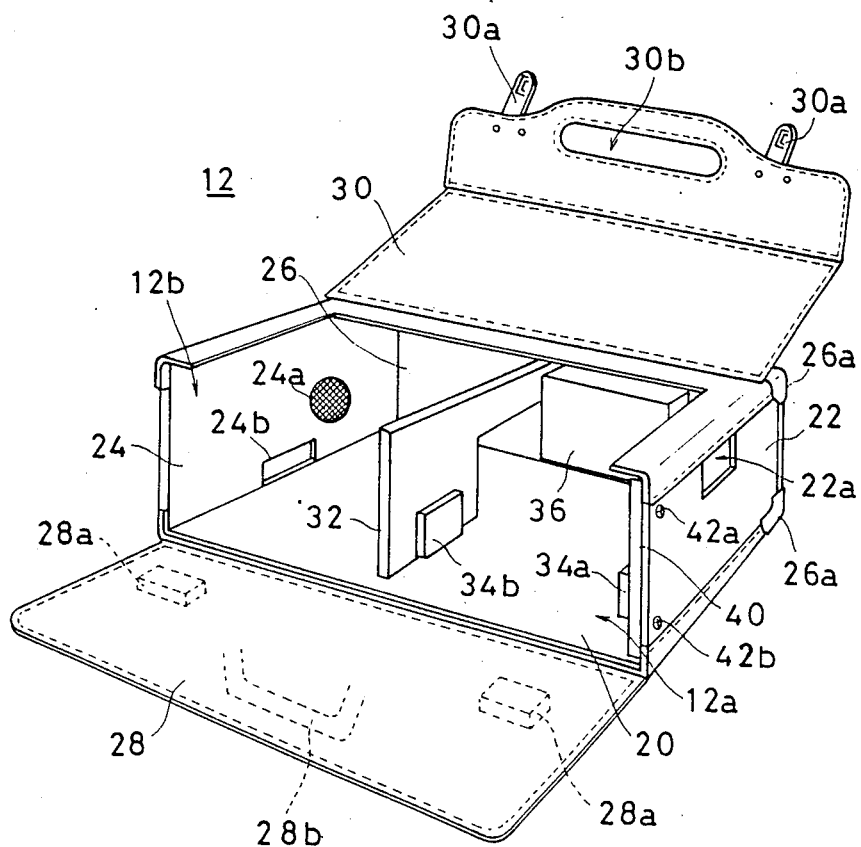
FIG. 1 is a perspective view showing an example of a case used in an embodiment of the present invention.

A case 12 is made of a, a ligneous material such as a veneer plate covered thereon by a leather material such as a synthetic leather and a synthetic resin material. The case 12 comprises a bottom 20, a right side portion 22, a left side portion 24, a rear portion 26, a front cover 28 and a top cover 30 and a rectangular space is defined by the material previously mentioned.

The metal fittings 28a and 30a mutually engageable are fixed respectively to the front cover 28 and the top cover 30 of the case 12. By engaging the metal fittings 28a and 30a the front cover 28 and the top cover 30 may be closed and the case 12 may be retained in that state. A handle 28b formed on the front cover 28 extends through an aperture 30b formed on top cover 30, so as to make the case 12 portable. When placing the case 12 down, reinforcing metal fittings 26a fixed to each corner of the rear portion 26 of the case 12 serve as the legs.

A partition piece 32 is formed widthwise generally in the center within the case 12 at a right angle to the bottom 20 so that the space in the case 12 is divided into a right space 12a and a left space 12b.

In the right space 12a of the case 12, a pedestal piece 34a is formed on the left side of the right side portion 22 of the case 12 and a pedestal piece 34b is fixed to the right side of the partition piece 32.

Figure 2:
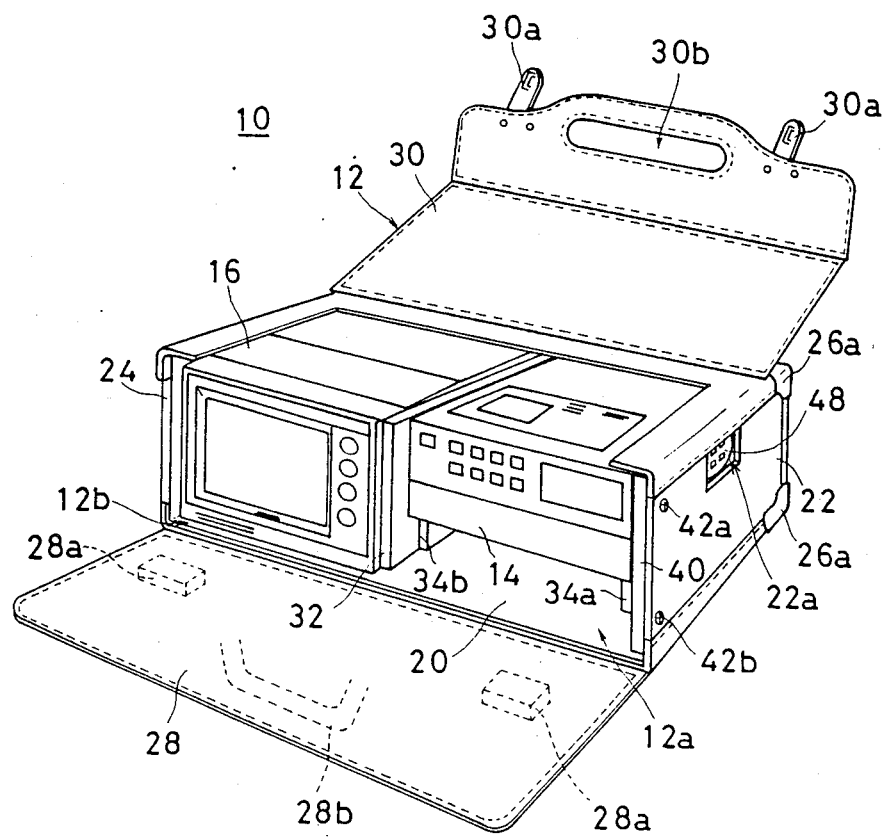
Figure 3:
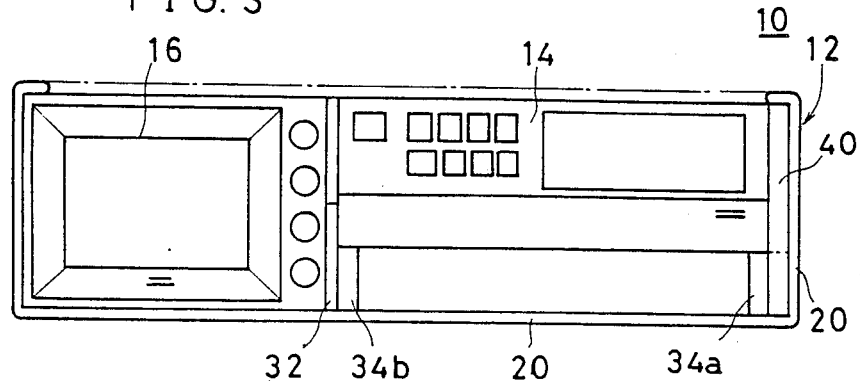

As shown in FIGS. 2 and 3, a video deck 14 is stored in the space 12a and a TV monitor 16 is stored in the space 12b of the case 12. As the video deck 14, for example, a Canon Portable Video Recorder VR-L50, by Canon Inc. may be used and as the TV monitor 16, a Hitachi IC Transistor Color Monitor Model 5, C5-612S, by Hitachi, Ltd. may be used.

Moreover, a video disc may be used as the video apparatus and as the monitor, liquid crystal, plasma and EL displays, etc. may be used besides the CRT display.

A shield box 36 is mounted on the rear portion 26 inside the right space 12a of the case 12 as shown in FIG. 1. The shield box 36 is formed by a conductive material such as a metal like aluminum and a conductive resin. In the shield box 36, as clearly seen in FIG. 4, there is provided a switching power supply 18. As the switching power supply 18, for example, a K Series Switching Regulator K25 by Elco Co. may be used.

Figure 4:
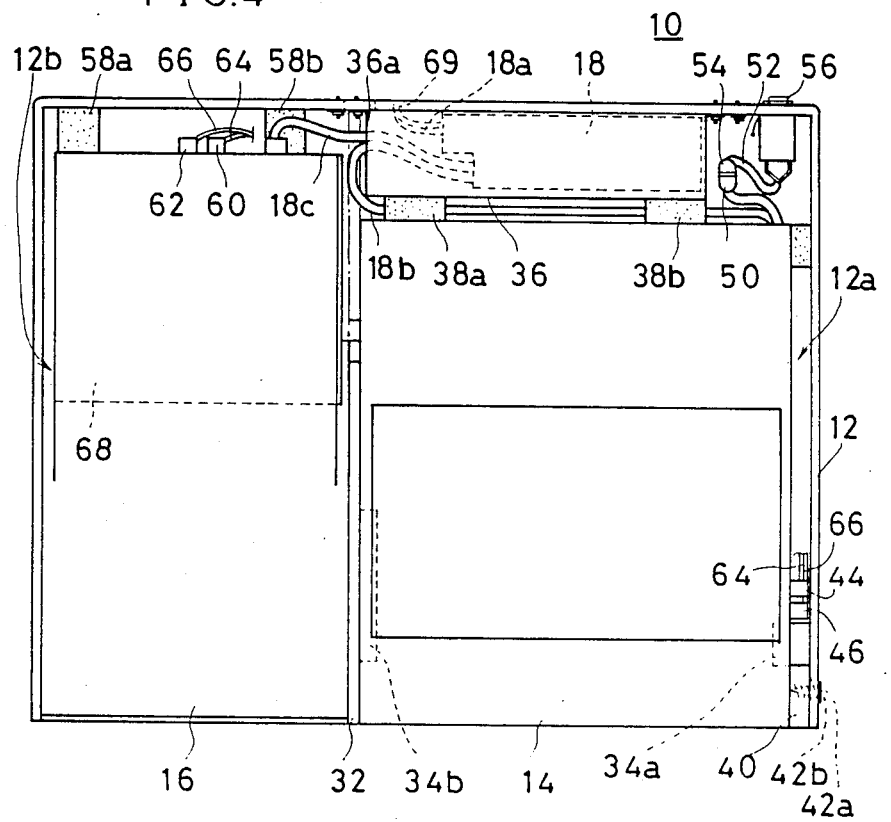

The video deck 14 is contained in the space 12a of the case 12 by being placed on the pedestal pieces 34a and 34b, and retaining members 38a and 38b are stuck onto the rear end thereof, for example, by an adhesive as shown in FIG. 4. The retaining members 38a and 38b are made of an elastic material such as urethane, sponge and rubber. Accordingly, the rear side of the video deck 14 is in contact with the shield box 36 via the retaining members 38a and 38b.

A left side wall of the video deck 14 is in contact with the partition piece 32, while a right side wall thereof is arranged apart from the right side portion 22 of the case 12 and a supporting member 40 is disposed therebetween.

The supporting member 40 is fixed at the two upper and lower portions thereof by a fixing member such as wood screws 42a and 42b from the surface side (outside of the case 12) of the right side portion 22 of the case 12. Thus, the video deck 14 is held between the partition piece 32 and the right side portion 22 and retained rigidly inside the case 12. The supporting member 40 may be dismounted by removing the wood screws 42a and 42b. By dismounting the supporting member 40, removing and inserting the video deck 14 from the case 12 may be accomplished smoothly.

On the right side wall of the video deck 14, terminals 44 and 46 for video and voice outputs are mounted. These terminals are sufficiently spaced from the right wall portion 22 of the case 12 so as not to make contact therewith when the video deck 14 is stored.

A space is formed between the bottom 20 of the case 12 and the bottom of the video deck 14 by the pedestal pieces 34a and 34b. A user may store, for example, an AC cord 70 shown in FIG. 8, an RF drawer cord 80 shown in FIG. 9, video tapes and so on in the space. Accordingly, the user may carry associated equipment in one case 12 in a package.

Figure 5:
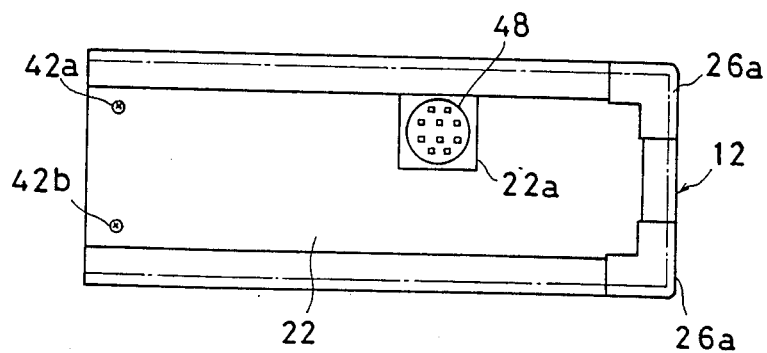

Moreover, a square aperture 22a is formed as particularly shown in FIG. 5 at the upper center of the right side portion 22 of the case 12 corresponding to a camera input terminal 48 formed on the right side wall of the video deck 14. Through the square aperture 22a a video camera (not shown) may be connected to the video deck 14 from outside the case 12.

Figure 6:
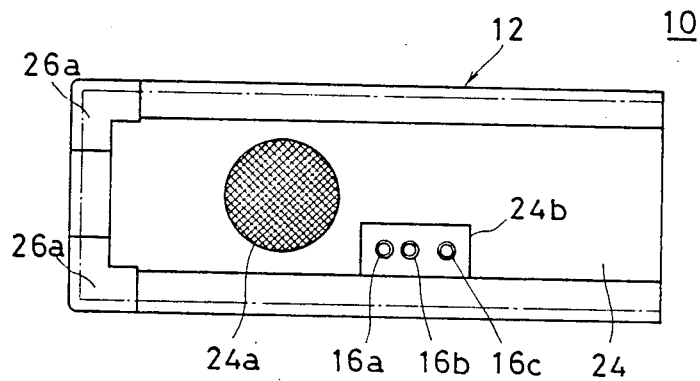
Figure 7:
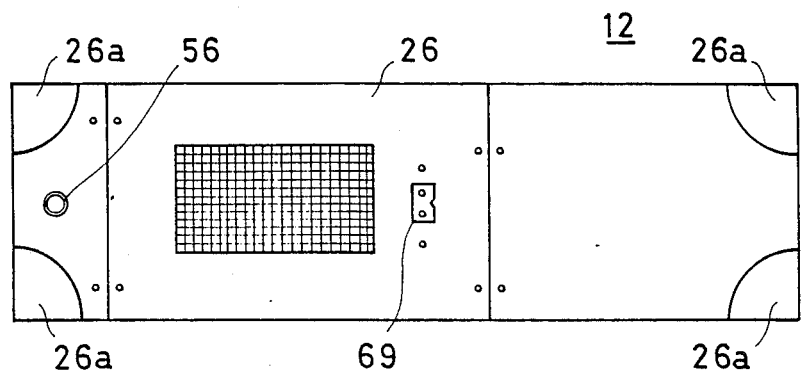

Furthermore, a circular net aperture 24a is formed on the left side portion 24 of the case 12 on the left from the center corresponding to a speaker of the monitor 16 as particularly shown in FIG. 6. On the right side from the center of the left side portion 24 of the case 12, an aperture 24b is formed corresponding to a vertical-hold controlling knob 16a, a brightness controlling knob 16b and an earphone jack 16c formed on the left side of the monitor 16.

On the TV monitor 16, a shield plate 68 is an L-shaped cross section for shielding the right side wall and a part of the bottom thereof is mounted as particularly shown in FIG. 4. The shield plate 68 is attached, for example, with double-side adhesive tape. On the rear portion of the TV monitor 16, retaining members 58a and 58b are fixed at two right and left portions thereof, as particularly shown in FIG. 4. The retaining members 58a and 58b are formed by an elastic material, such as urethane, sponge, rubber and the like. Accordingly, the monitor 16 is retained rigidly inside the case 12 apart from the rear portion 26 of the case 12.

Figure 11:
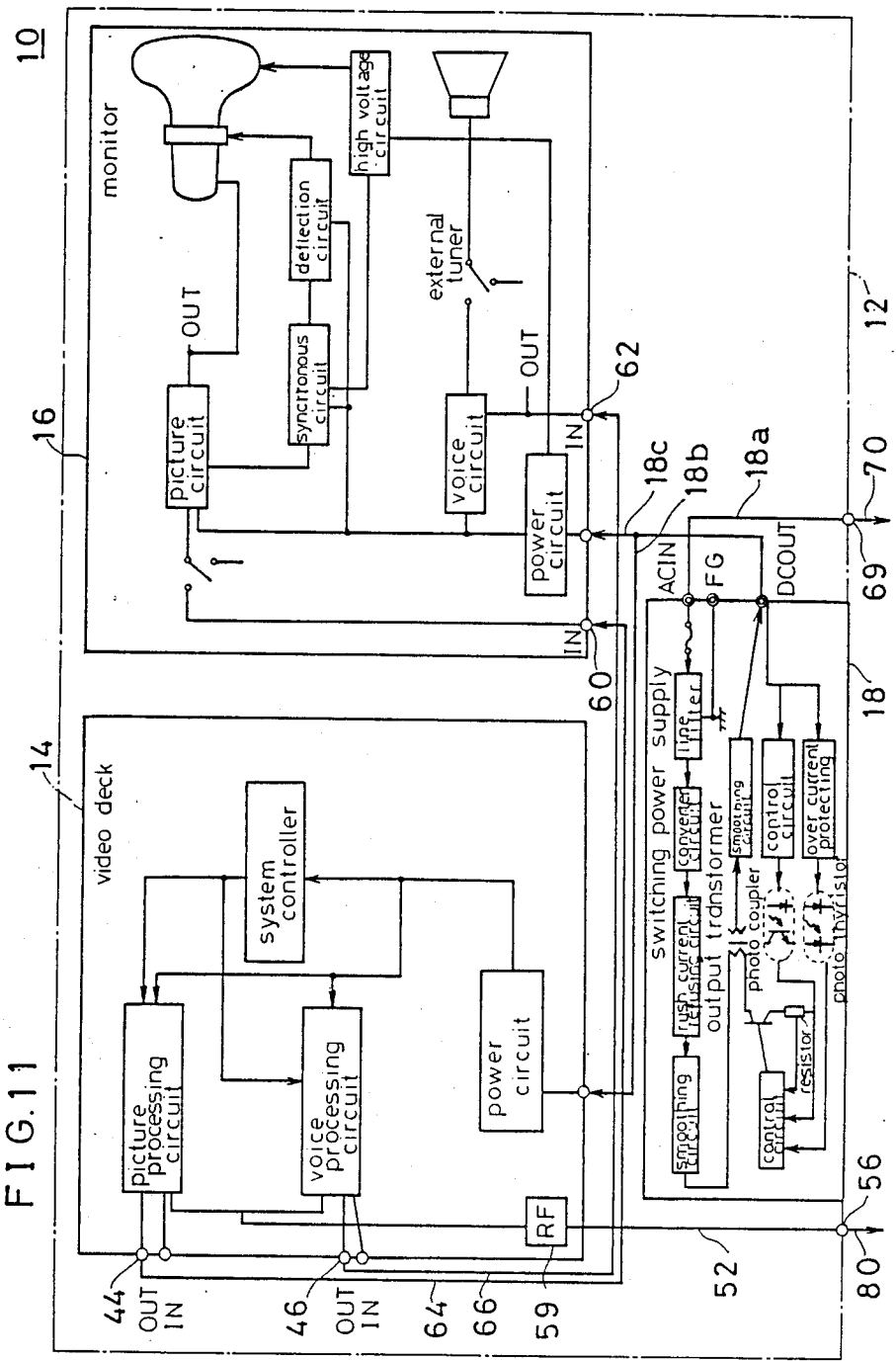
FIG. 11 is the block diagram of a portable type audio-visual sensory apparatus shown in FIGS. 2 through 7.

Referring to FIG. 11, the electric connections of the video deck 14, the monitor 16, the switching power supply 18 and so on will be described in detail.

The video deck 14 includes a power circuit, a system controller, a picture processing circuit and a voice processing circuit and so on as particularly shown in the block diagram of FIG. 11.

The monitor 16 includes a power circuit, a picture circuit, a synchronous circuit, a deflection circuit, a high voltage circuit, a CRT, a voice circuit, a speaker and so on.

The switching power supply 18 includes a line filter, a converter circuit, a rush current refusing circuit, a smoothing circuit, an output transformer, a rectifier smoothing circuit, a control circuit, an overcurrent protecting circuit and so on.

Figure 8:
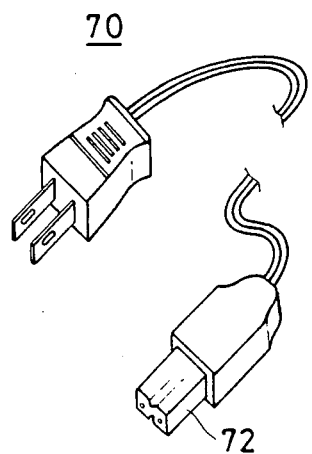
FIG. 8 is a perspective view showing an example of an AC cord.

The AC power input terminal of the switching power supply 18 is connected to a male connector 69 mounted through the rear portion 26 of the case 12. A female connector 72 of the AC cord 70 shown in FIG. 8 is inserted into the connector 69 and an AC source is supplied to the switching power supply 18 through the AC cord 70.

The DC power output terminal of the switching power supply 18 is connected to the DC power input terminal of the video deck 14 and the DC power input terminal of the monitor 16 respectively by the coaxial code 18b and 18c led through the aperture 36a on the shield box 36. Accordingly, DC power may be supplied to the video deck 14 and the monitor 16 by one switching power supply 18. Since the power device of the video deck 14 and the monitor 16 is constituted by one switching power supply 18 the size and weight of a portable type audio-visual apparatus may be reduced as compared with the prior art having a power device constituted by two sources for the video deck and the monitor. The present invention results in considerably easy transportation thereof as compared with the prior art.

Since the switching power supply 18 as the power device is shielded from the video deck 14 and the monitor 16 by the shield box 36, the noise generated therefrom will not influence the voice output or the video output of the monitor 16 negatively.

Now, in the embodiment, although the power device of the video deck and the monitor is constituted by one switching power supply, two power devices for the video deck and the monitor may also be used.

Furthermore, the power from the DC source outside the case may be supplied to the video deck and the monitor by connecting a jack between the DC power output terminal of the switching power supply 18 and the coaxial cords 18b and 18c and mounting the jack so as to extend through the case 12, then inserting a plug connected to a DC source outside the case, for example, such as a car battery and the like thereinto.

A video output terminal 44 and a voice output terminal 46 of the video deck 14 and a video input terminal 60 and a voice input terminal 62 of the monitor 16 are respectively connected by connecting coaxial cables 64 and 66 as shown in FIG. 11. Then, the connecting coaxial cables 64 and 66 are led to the rear side of the video deck 14 from the right side of the video deck 14 through the rear side thereof.

An RF output terminal 50 is drawn out from the rear side of the video deck 14 as shown in FIG. 4. A connector 54 connected to one end of a coaxial cable 52 is inserted into the RF output terminal 50 and the other end thereof is connected to a jack 56 mounted through the rear portion 26 of the case 12. The jack 56 is merely required to be mounted through the case 12, and accordingly it may be mounted, for example, through the right side portion 22 of the case 12.

Figure 9:
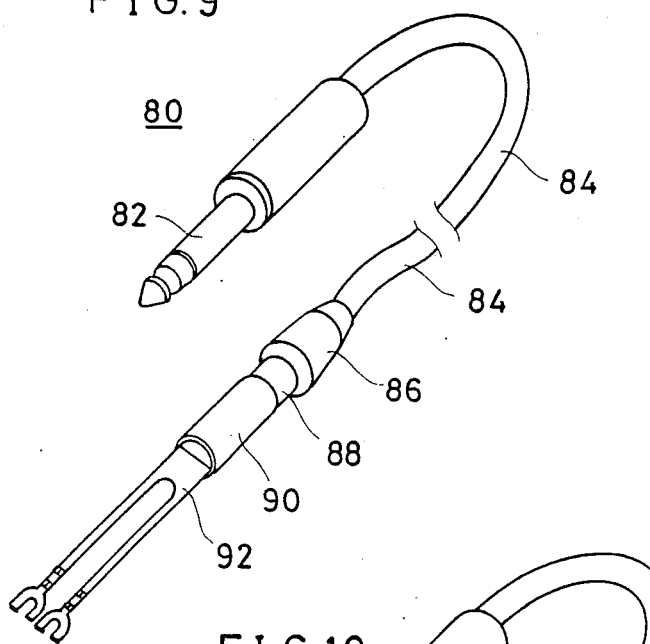

To the jack 56, for example, a plug 82 of the RF drawer cord 80 shown in FIG. 9 may be inserted from outside the case 12. Accordingly, the RF output terminal 50 of the video deck 14 may be drawn out by the cord 80 as the video deck 14 being stored in the case 12. The RF output terminal 50, namely, the cord 80 is used when connecting to the other monitor (not shown). When connecting the RF output terminal 50 of the video deck 14 and the external monitor, the covers 28 and 30 of the case 12 may remain closed as is, thus resulting in a favorable space factor. This structure provides a good result to the user when using the portable type audio-visual apparatus 10 by connecting to an external monitor in the limited space.

A video signal (a base band signal) and a voice signal may be drawn out from the video deck 14 when necessary, in the same manner as previously described.

The RF drawer cord 80 includes the plug 82 as particularly shown in FIG. 9. To the plug 82, one end of a coaxial cable 84 is connected and, to the other end thereof a male coaxial connector 86 is coupled, to which a female coaxial connector 88 is inserted. Then, to the female coaxial connector 88, an input side of an impedance matching device 90 such as a balun transformer is connected and to an output side thereof a parallel feeder 92 is connected.

Figure 10:
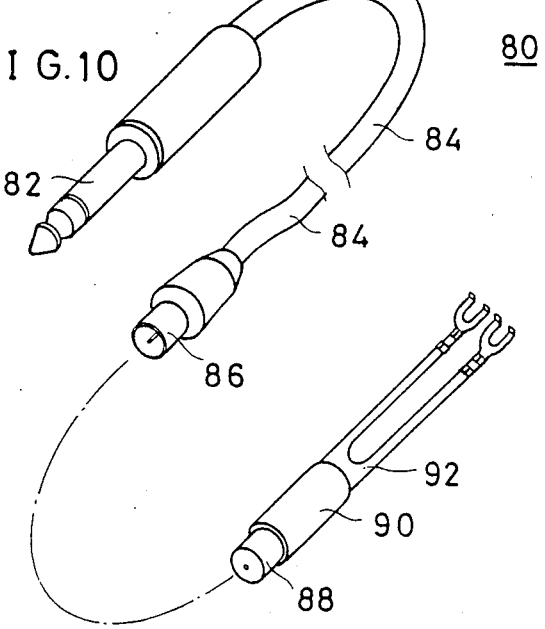

In the RF drawing cord 80, the female coaxial connector 88 may be disconnected from the male coaxial connector 86 as shown in FIG. 10. When disengaging the female coaxial connector 88 from the male coaxial connector 86, the latter may be connected to an RF input terminal of a female coaxial connector of the external monitor, thus the coaxial cable and the parallel feeder can be used in common. Accordingly, when using the RF drawer cord 80, it is not necessary to prepare the two cords separately for the coaxial cable and the parallel feeder as in the past.

In the embodiment, although a special cord was used as the RF drawer cord, two cords for the coaxial cable and the parallel feeder may be used as in the past.

Next, referring to FIGS. 12 through 18, another embodiment of the present invention will be described.

Figure 12:
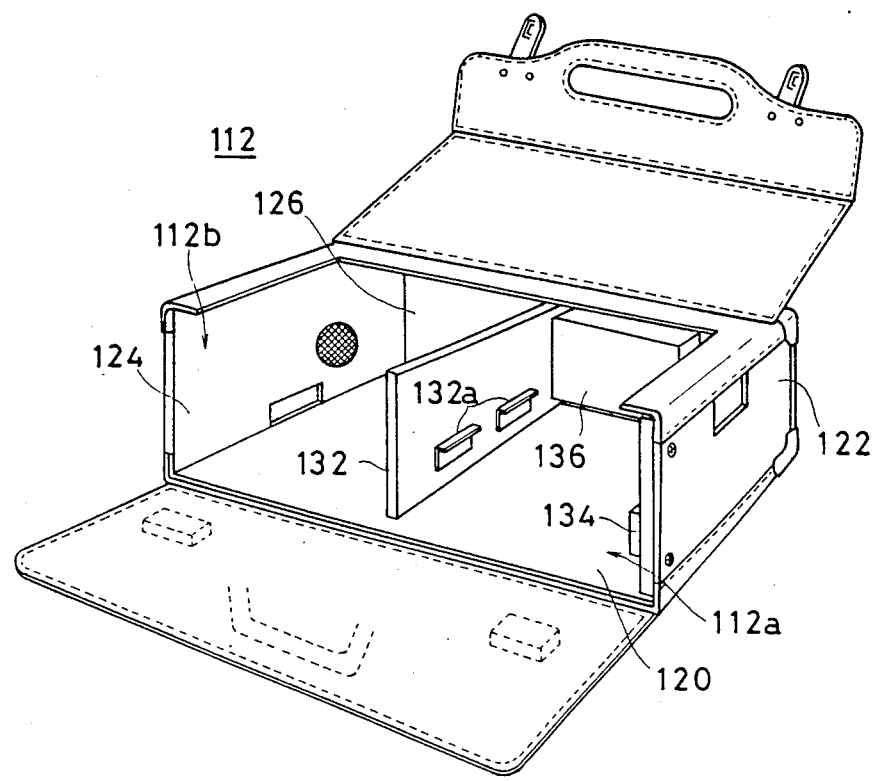
FIG. 12 is a perspective view showing a case used in an embodiment of the present invention.

Inside a case 112, a partition piece 132 is formed generally in the center widthwise an protrudes at a right angle to a bottom 120. The partition 132 is made of a a conductive material such as a metal like aluminum, copper and so on, synthetic resin, synthetic rubber and so on covered with a relatively soft leather material and the like having an excellent surface such as, for example, and a synthetic leather. Meanwhile, in a right side space 112a of the case 112, a shield box 136 is mounted on an inner surface of the rear portion 126 of the case 112 as shown in FIG. 12. The shield box 136 is formed with a conductive material, such as a metal like aluminum, copper and so on, conductive resin, and conductive rubber.

Figure 17:
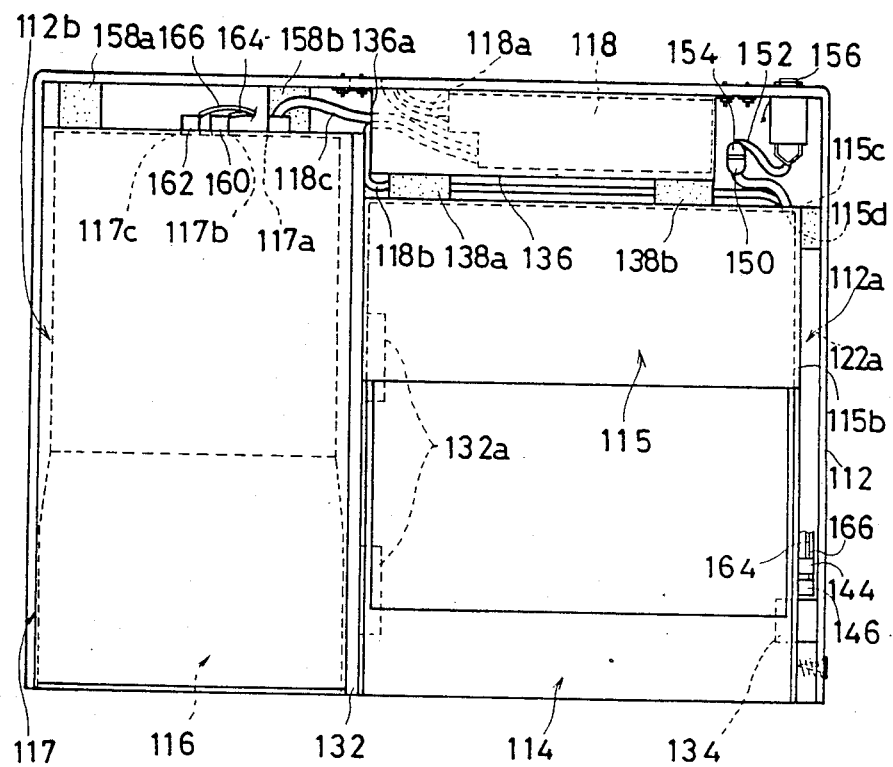

Inside the shield box 136, a switching power supply 118 is stored as particularly shown in FIG. 17.

A video deck 114 is stored in the space 112a of the case 112 as the rear portion thereof is contained in a shield box 115. That is, the video deck 114 is placed on pedestal pieces 132a and 134 together with the shield box 115.

The shield box 115 is formed in a box shape having an opened front and a bottom 115a thereof extending forward. The shield box 115 is formed with a conductive material such as a metal like aluminum and copper, conductive resin, conductive rubber and so on. For example, when an aluminum plate is used, a thickness of 0.4 mm is use taking into account the weight and the strength thereof.

On the upper right side of the shield box 115, a notch 115b is formed corresponding to a camera input terminal 148 (FIG. 13) formed on the right side wall of the video deck 114. Then, on the rear portion of the shield box 115, two holes 115c and 115d are formed lengthwise. The hole 115c is for leading a coaxial cord 118b (FIG. 17) to be connected to a DC power input terminal of the video deck 114 therethrough, and the other hole 115d is for leading an RF output terminal 150 (FIG. 17) of the video deck 114 therethrough. Now, a rear portion of the video deck 114 is contained in the shield box 115, and thereby the rear and lower portions of the video deck 114 are shielded.

Figure 13:
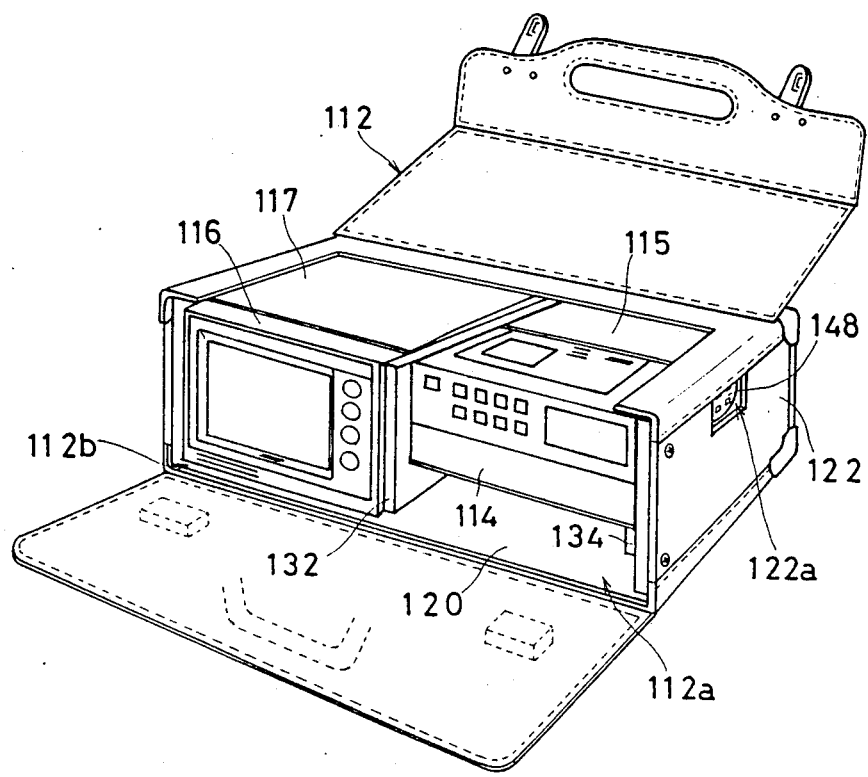
FIG. 13 is a perspective view showing a video deck and a TV monitor stored in the case.
Figure 14:
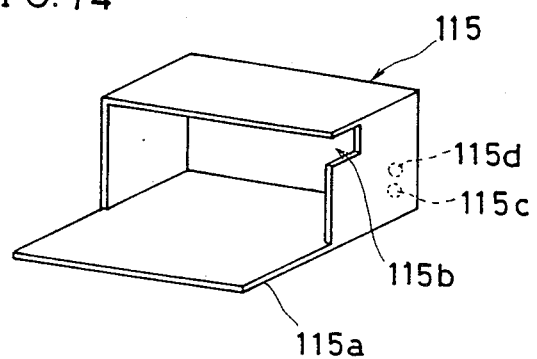
Figure 15:
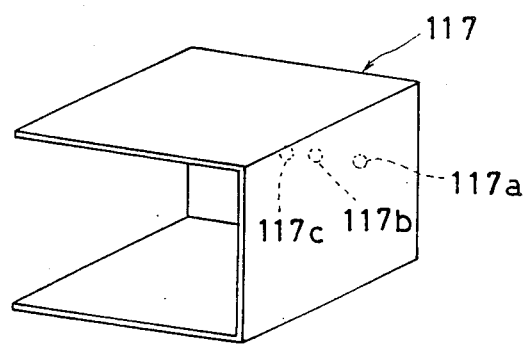
Figure 16:
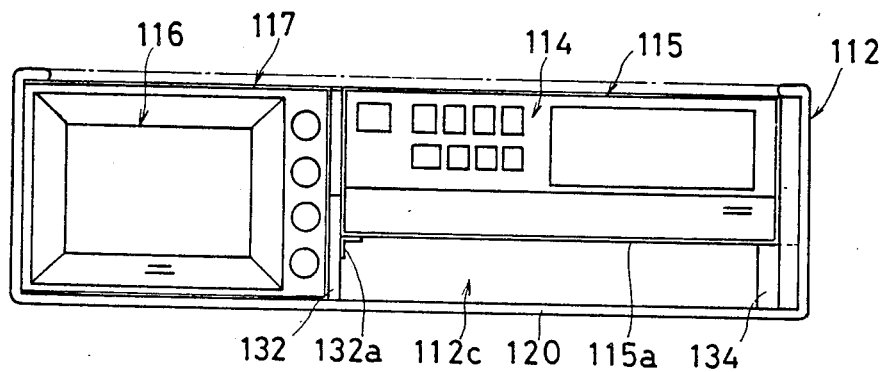

A TV monitor 116 is stored in a space 112b as the rear portion thereof is contained in a shield box 117 as shown in FIG. 13.

The shield box 117 is formed in a box shape having an opened front and left side thereof and formed with the same conductive material as the shield box 115 previously described.

On the rear portion of the shield box 117, three holes 117a, 117b and 117c are formed widthwise. The hole 117a is for leading a DC power input terminal of the TV monitor 116 therethrough, while holes 117b and 117c are for leading a video input terminal 160 and a voice input terminal 162 of the TV monitor 116 respectively therethrough. Then, the TV monitor 116 is stored in the shield box 117, and thereby the upper, lower, right and rear portions of the TV monitor 116 are shielded.

On the rear end of the shield box 115, retaining members 138a and 138b are attached as shown in FIG. 17, which are formed with an elastic material such as urethane, sponge, sponge rubber, rubber and like materials. Accordingly, the rear portion of the shield box 115 is in contact with a shield box 136 via the retaining members 138a and 138b. Now, a retaining member made of an elastic material such as rubber and the like having a shape suitable for receiving the rear portion of the shield box 115 therein, may be formed inside the case 112 in place of the retaining member 138a and 138b. Thereby, the shield box 115, namely, the video deck 114 may be retained more rigidly.

Furthermore, on the rear portion of the shield box 117, retaining members 158a and 158b are fixed on the both sides as particularly shown in FIG. 17. The retaining members 158a and 158b are formed with an elastic material such as urethane, sponge, sponge rubber, rubber and the like. Accordingly, the TV monitor 116 and the shield box 117 are retained rigidly in the case 112 by being spaced from the rear portion 126 thereof. Now, a retaining member made of an elastic material such as rubber and the like having a shape suitable for receiving the rear portion of the shield box 117 therein, may be formed on the rear portion thereof in place of the retaining members 158a and 158b. Thereby, the shield box 117, namely, the TV monitor 116 may be retained more rigidly.

The switching power supply 18 is shielded from the video deck 114 and the TV monitor 115 by the shield box 136. The rear and lower portions of the video deck 114 are shielded by the shield box 115 and the top, lower, right and rear portions of the TV monitor 116 are shielded by the shield box 117. The video deck 114 and the TV monitor 116 are shielded by the partition piece 132. Accordingly, the noise originating from the switching power supply 118 and the TV monitor 116 will not negatively influence the voice output and the picture output of the TV monitor 116.

As such, in order to shield the noise from the switching power supply 118 and the TV monitor 116, the rear and the bottom of the rear half containing the preamplifier which picture signal is subjected to an influence by the noise, may be shielded as shown in single broken lines in FIG. 19 as to the video deck 114.

As to the TV monitor 116, the rear, the bottom of the rear half and the right side of the rear half containing a high voltage transformer, a board and so on as the noise source may be shielded as shown in single dotted lines in FIG. 20. In short, the video deck, the TV monitor and the switching power supply are merely required to be shielded by the shielding members therebetween.

Next, referring to FIG. 17, connections for each piece of equipment will be described.

A video output terminal 144 and a voice output terminal 146 of the video deck 114 and the video input terminal 160 and the voice input terminal 162 of the TV monitor 116 are connected respectively by connecting coaxial cables 164 and 166 as particularly shown in FIG. 17. In this case, the video input terminal 160 and the voice input terminal 162 of the TV monitor 116 are led through the holes 117b and 117c formed on the rear portion of the shield box 117, and the connecting coaxial cables 164 and 166 for the each terminal are led to the rear of the TV monitor 116 from the right side of the video deck 114 through the rear side thereof.

As shown in FIG. 17, an RF output terminal 150 of the video deck 114 is drawn out from the rear portion of the shield box 115. In this case, the RF output terminal 150 of the video deck 114 is led through the hole 115d on the rear portion of the shield box 115 and a connector 154 connected to a coaxial cable 152 at one end is inserted thereinto. Now the other end of the coaxial cable 152 is connected to a jack 156 mounted through the rear portion 126 of the case 112 inside the case 112. The jack 156 is merely needed to be mounted through the case 112, and for example, it may be mounted through the right side portion 122 thereof.

The jack 156 and a plug 182 may be constituted by a pin jack 156a mounted through the case 112 and pin plug 182a engageable thereto or further by the other type of jack and plug.

As a conductive material for shield boxes 115, 117, 136 and the partition piece 132, a material coated with conductive paint or a magnetic alloy such as a permalloy may be used besides the examples previously mentioned.

Figure 21:
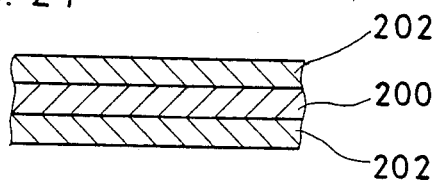
FIG. 21 is a cross-sectional view showing an example of a material of a shield member.
Figure 22:
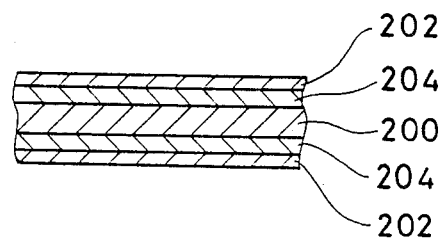
FIG. 22 is a cross-sectional view showing another example of a material of a shield member.
Figure 23:
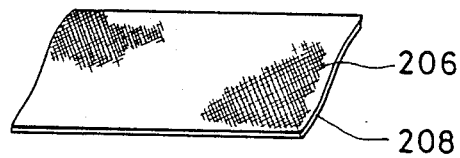
FIG. 23 is a perspective view showing another example of a material of a shield body.
Figure 24:
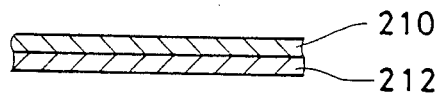
FIG. 24 is a cross-sectional view showing another embodiment of a material of a shield member.

Furthermore, in the embodiment described above, as the material for shield boxes 115, 117 and 136, although a conductive material alone was used, a conductive material 220 which main surface is covered with a surface material 202 consisting of leather material such as synthetic leather may be used. Moreover, conductive material 200 consisting of a relatively soft material, which main surface is covered by a rigid ligneous material 204 such as a veneer plate, and the surface thereof is covered by the leather material 202 such as the synthetic leather, may be used as the material for shield boxes 115, 117 and 136 and the partition piece 132 as shown in FIG. 22. Meanwhile, as shown in FIG. 23, a material consisting of a metal screen 206 such as aluminum, copper and so on attached with double sided adhesive tape 208 or, for example, a metal foil or a metal plate 210 such as aluminum and the like having an adhesive layer 212 on one main surface thereof as shown in FIG. 24 may be attached to the surfaces of the video deck 114, the TV monitor 116 and the switching power supply 118. As such, when the metal materials such as the metal screen, the metal foil, and the metal plate are attached, the thickness can be reduced without influencing the strength, thus retarding the increase in weight caused by the metal material. In the material shown in FIGS. 21 and 22, it is understood that an insulating material such as paint and synthetic resin may be used in place of the surface material 202 consisting of leather material or ligneous material 204.

FIG. 19 is a perspective view of another case body different from the embodiment previously mentioned.

FIG. 20 is a plan view of the case body shown in FIG. 19.

Inside a case body 312, partition piece 332 for the small size audio-visual sensory apparatus (TV monitor 116, video deck 114, etc.) having a U-shaped front section is mounted at a right angle to a bottom 320 generally in the center widthwise, which is made of a light frame such as aluminum and the like.

Then, between the partition piece 332 and and a right side portion 322, fixing pedestals 334A and 334B are mounted respectively in parallel.

A power source 118 for the small size audio-visual apparatus is provided independently of the small size audio-visual apparatus (TV monitor 116, video deck 114, etc.). The power source 118 is stored and secured in compact inside the case bottom 320 in a most fitting state to the shape of the case body 312 so as not to leave any extra space therein. The power source 118 is fixed to the case body 312 with a removable type utilizing piles, a so called magic tape 319A.

Magic tape 319B for fixing the small size audio-visual apparatus (video deck 114) is fixed to the surface of the fixing pedestal 334B.

By fixing in such a manner, any damage caused by bumping of equipment can be prevented and the maintenance thereof may be simplified.

Figure 26:
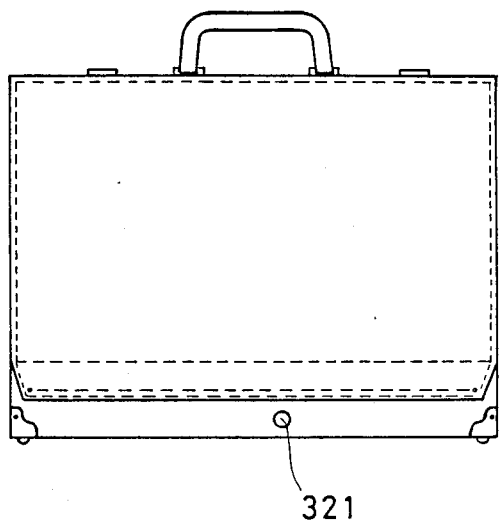
FIG. 26 is a plan view of the case body shown in FIG. 25.

A hole 321 for installing an antenna is formed near the rear portion 320 of the case body 312 as shown in FIG. 26 in such a way that it comes to the upper surface in use, that is, when laying down.

By disposing the hole 321 for the antenna (shown in FIG. 26), the antenna can be installed and TV broadcasts can be received and recorded.

Figure 25:
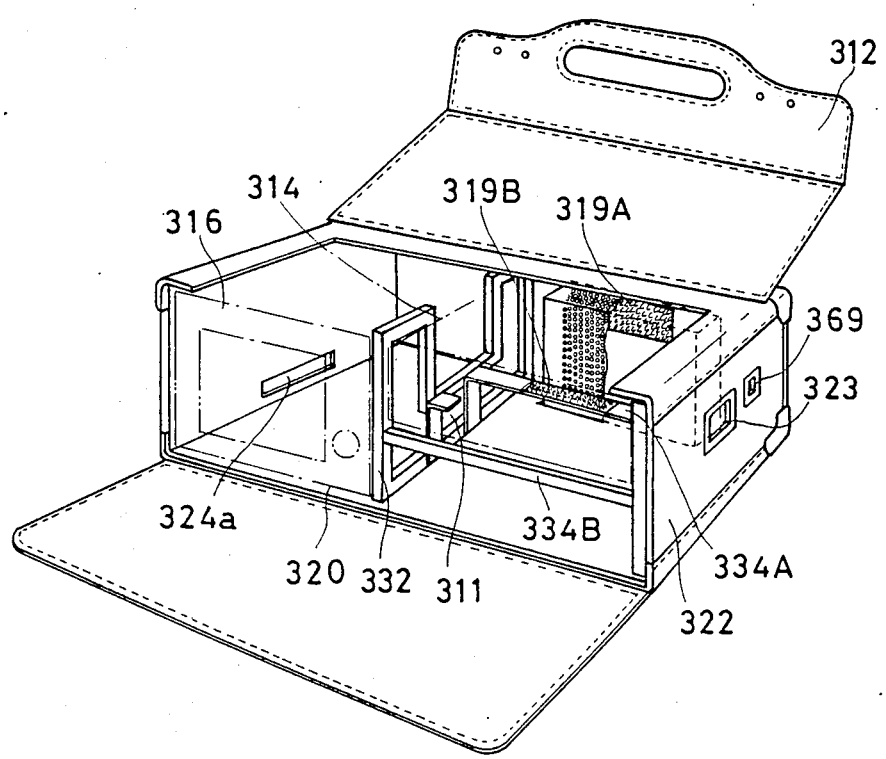
FIG. 25 is a perspective view of a case body different from the embodiment previously mentioned.

An intake hole 369 from an external power source is provided on the right side portion 322 as shown in FIG. 25 and formed so as to be able to take in the power easily. A hole 323 for a video deck control and for taking out input and output cords for the picture and voice signals is formed similarly on the right side portion 322.

A monitor control hole 324a is formed on the left side portion as shown in FIG. 25, so that the monitor may be controlled easily from the outside.

Since the holes 369, 323 (shown in FIG. 25) and 324a (shown in FIG. 25) are provided, the video deck may be controlled while being stored in the case. Furthermore, due to the structure, not only is the control convenient but also the picture and voice signals from the RF signal may be taken out easily. Thereby, the storing spaces for the TV monitor 316 and the video deck 314 may be minimized simultaneously.

Figure 27:
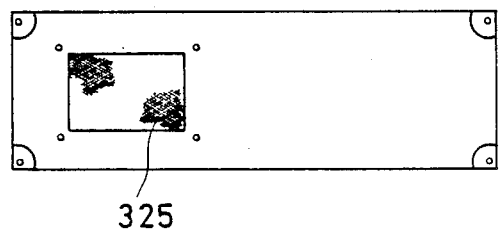
FIG. 27 is a side view of the case body shown in FIG. 25.

A radiating hole 325 is provided on the bottom 320 of the case body 312 as shown in FIG. 27. The radiating hole 325 serves for radiating heat from the power source 7 of the small size audio-visual sensory apparatus. Although it is provided on the bottom 320, the radiation will not deteriorate the case since the case is laid down in use.

As such, the advantages of fixing by the partition piece 332 and the fixing pedestals 334A and 334B, enable the shortening of the distance between the TV monitor 316 and the video deck 314, thus reducing the width of the case body 312 as well as preventing the trouble caused by the bumping of the TV monitor 316 and the video deck 314, resulting in increased safety.

A space 311 (refer to FIG. 25) formed in the body portion of the partition piece 332A is disposed under a boundary between the video deck 316 and the TV monitor 316, thereby giving the advantage of drawing out the TV monitor 316 readily from the case body 312 as the wiring being connected therebetween.

As a mounting of the case body 312, not a conventional synthetic leather but materials such as a Kuraline (registered trade mark) by Kurare Co., Ltd. and a Pasco, a kind of paper, and so on were used in consideration of not only the reduction of weight but also the durability.

In such a case, although it must be smaller and lighter, according to the present invention, when taking the embodiment previously described as an example, the weight was reduced to about 6.3 kg from the total weight, which was 9 kg at the minimum in the past including the small size audio-visual apparatus.

Then, the volume decreased also to 39 cm wide × 14.5 cm deep × 29.5 cm high, from the past 41 cm wide × 17 cm deep C 32 cm high.

Thereby, the weight has almost reached the maximum weight of 6 kg acceptable for a man to carry about relatively easily.

EXPERIMENTAL RESULTS

First a sample I formed by removing a conductive material of the partition piece 132, shield boxes 115, 117 and 136 of the embodiment shown in FIGS. 13 through 17 was prepared. A sample II same as the embodiment shown in FIGS. 13 through 17 and a sample III same as the embodiment shown in FIGS. 2 through 4 were prepared.

Then, in samples I, II and III a picture from the same video tape was reproduced and the presence of the noise was compared. In this case, an image signal totally in blue color is recorded on the video tape to clearly distinguish the noise in the reproduced picture.

Figure 28:
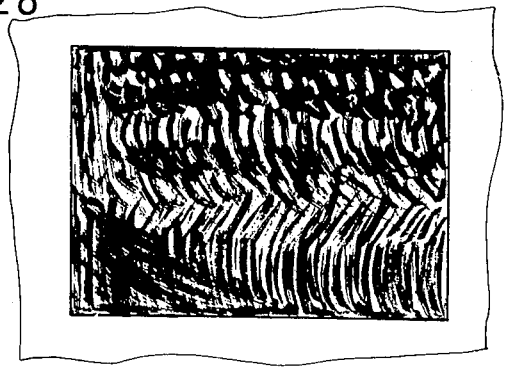
Figure 29:
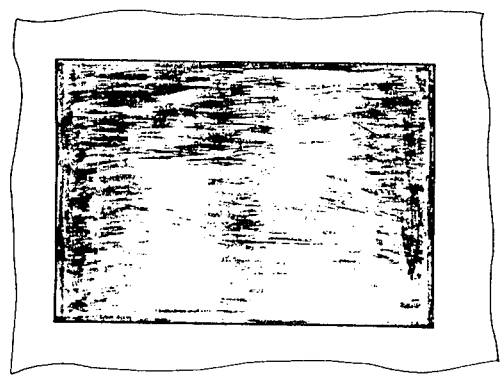
Figure 30:
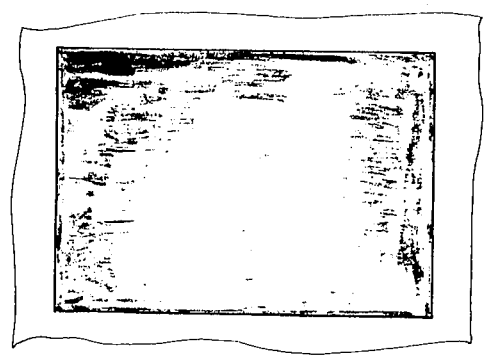

FIGS. 28, 29 and 30 show the reproduced pictures of samples I, II and III respectively. From FIGS. 28 through 30, it is apparent that the picture reproduced by sample I includes the noise and pictures reproduced by samples II and III do not include noise.

This is due to the fact that on sample I the radiation noises generated from the switching power supply and the TV monitor could not be shielded, but on the sample II such radiation noises were shielded by the conductive material of the partition piece 132 and the shield boxes 115, 117 and 136, and on the sample III such radiation noises could be shielded by the shield plate 68 and the shield box 36.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A portable case for audio-visual apparatus, comprising:
   a first case portion including a bottom portion and three side walls connected thereto so as to form a substantial portion of a generally rectangular box;
   a second case portion including a front cover and a top cover connected thereto, said second portion being connected at one edge thereof to said first case portion to complete, when in a closed position, said generally rectangular box;
   a partition piece formed in said case for dividing said case into a first section and a second section;
   a TV monitor removably mounted in said first section;
   means for developing the signal displayed on said TV monitor mounted in said second section;
   a switching power source mounted in said case for receiving power from an external source and supplying power to said TV monitor and said developing means; and
   shield means, located in said case, for preventing any noises from said switching power source from interfering with the operation of said TV monitor and developing means.

2. The portable case for audio-visual apparatus in accordance with claim 1, wherein said shield means is a box surrounding said switching power source.

3. The portable case for audio-visual apparatus in accordance with claim 2, further comprising a first shield means surrounding a portion of said TV monitor and a second shield means surrounding a portion of said developing means.

4. The portable case for audio-visual apparatus in accordance with claim 2, wherein said box is constructed of a conductive material.

5. The portable case for audio-visual apparatus in accordance with claim 2, wherein said switching power source is mounted in said second section of said case.

6. The portable case for audio-visual apparatus in accordance with claim 2, wherein said partition piece is constructed of conductive material.

7. The portable case for audio-visual apparatus in accordance with claim 1, further comprising shield means surrounding a portion of said TV monitor.

8. The portable case for audio-visual apparatus in accordance with claim 7, wherein said shield means surrounds a rear portion of said TV monitor.

9. The portable case for audio-visual apparatus in accordance with claim 7, wherein said shield means surrounding a portion of said TV monitor is a U-shaped plate.

10. The portable case for audio-visual apparatus in accordance with claim 9, wherein said plate is made of aluminum.

11. The portable case for audio-visual apparatus in accordance with claim 7, wherein said shield means surrounding a portion of said TV monitor is constructed of a conductive material.

12. The portable case for audio-visual apparatus in accordance with claim 1, further comprising shield means surrounding a portion of said developing means.

13. The portable case for audio-visual apparatus in accordance with claim 12, wherein said shield means surrounds a rear portion of said developing means.

14. The portable case for audio-visual apparatus in accordance with claim 12, wherein said shield means surrounding said developing means is an L-shaped plate.

15. The portable case for audio-visual sensory apparatus in accordance with claim 14, wherein said shielding plate is incorporated into said partition piece.

16. The portable case for audio-visual apparatus in accordance with claim 14, wherein said plate is made of aluminum.

17. The portable case for audio-visual apparatus in accordance with claim 12, wherein said shield means surrounding a portion of said developing means is constructed of a conductive material.

* * * * *